(12) United States Patent
Shin et al.

(10) Patent No.: US 6,531,758 B2
(45) Date of Patent: Mar. 11, 2003

(54) SEMICONDUCTOR INTEGRATED CIRCUIT WITH RESISTOR AND METHOD FOR FABRICATING THEREOF

(75) Inventors: Soo-Ho Shin, Seoul (KR); Won-Suk Yang, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/903,826

(22) Filed: Jul. 11, 2001

(65) Prior Publication Data

US 2002/0060351 A1 May 23, 2002

(30) Foreign Application Priority Data

Nov. 23, 2000 (KR) ............................................. 00-70011

(51) Int. Cl.[7] ......................... H01L 29/76; H01L 29/94; H01L 31/119; H01L 27/108; H01L 29/00
(52) U.S. Cl. ........................................ 257/536; 257/306
(58) Field of Search ................................ 257/295–310, 257/314–315, 536; 438/253–254, 396–398, 257.265

(56) References Cited

U.S. PATENT DOCUMENTS

| | | | | |
|---|---|---|---|---|
| 5,066,997 A | * | 11/1991 | Sakurai et al. | ............... 257/211 |
| 5,895,947 A | * | 4/1999 | Lee et al. | .................... 257/303 |
| 6,150,689 A | * | 11/2000 | Narui et al. | ................. 257/306 |

* cited by examiner

*Primary Examiner*—Cuong Q Nguyen
(74) *Attorney, Agent, or Firm*—Marger Johnson & McCollom, P.C.

(57) ABSTRACT

A resistor which have a stable resistance value and a method for fabricating the same without increasing the area of a semiconductor integrated circuit. To prevent a dishing phenomenon, the resistor is formed on the dummy gate electrode structure which have been formed in a peripheral circuit region and/or it is formed between a pair of dummy bit line structures. Regardless of a process condition the width and height of the resistor can be determined in a certain range with use of the capping layer and spacers of the dummy gate electrode structure and/or the capping layer and/or spacers of the dummy bit line structure.

15 Claims, 11 Drawing Sheets

SEMICONDUCTOR INTEGRATED CIRCUIT WITH RESISTOR AND METHOD FOR FABRICATING THEREOF

This application claims priority from Korean Patent Application Serial No. 00-70011 filed Nov. 23, 2000, the contents of which are incorporated herein by reference in their entirety.

BACKGROUND OF THE INVENTION

1. Field of the Invention

The present invention relates to a semiconductor integrated circuit, and more particularly, to a semiconductor integrated circuit with a resistor and a method for fabricating thereof.

2. Description of the Related Art

A semiconductor integrated circuit includes a cell array region consisting of a plurality of unit cells and a peripheral circuit region which is located in the outside of the cell array region and consists of semiconductor circuits which control operations and input/output of the unit cell, for example a driver, a buffer or an amplifier. Each of the semiconductor circuits used in the two regions includes a transistor which is an active device and a resistance which is a passive device, basically. Consequently, a manufacturing process of a semiconductor integrated circuit accompanies processes of forming a plurality of transistors and resistors. In addition when a semiconductor device is formed in a cell array region, another semiconductor device of the same kind is also formed in a peripheral circuit region simultaneously.

In general, a gate poly resistance device using a dummy gate electrode structure which is formed in a peripheral circuit region and is made of the same material with another gate electrode structure formed in a cell array region, a self-alignment contact poly plug resistor using a self-alignment contact plug which is formed between the dummy gate electrode structures and is made of the same material with another self-alignment contact plug formed in the cell array region, or a plate electrode resistor which is made of the same material as another plate electrode formed in a cell array region, such as, a titanium nitride layer and polysilicon, has been used in conventional semiconductor integrated circuits. The gate electrode structure and the dummy gate electrode structure each includes a gate insulating layer, a gate electrode, a capping layer formed on the top surface of the gate electrode, and a pair of spacers formed at each side of the gate electrode.

The resistor used in a peripheral circuit region is required to exhibit a value of several kΩ or hundreds of kΩ. When the gate polyresistor having a polycide structure is used, its length must be increased, because the gate polyresistor exhibits a low face resistance. Accordingly, the size of a semiconductor integrated circuit must be increased.

The above self-alignment contact plug resistor is formed in a peripheral circuit region at which another self-alignment contact plug, that is, a bit line contact plug, is formed in a cell array region. Subsequently, a bit line is formed in the cell array region and the peripheral circuit region, and then an impurity ion such as N+ or P+ is inserted into the bit line. The specific resistance of a material forming the self-alignment contact plug can be varied by a heat treatment subsequent to a doping process or an impurity ion inserting process. In addition, the heights of the self-alignment contact plug resistor in the peripheral circuit region the self-alignment contact plug in a cell array region are also changed according to conditions of mechanical and chemical grinding processes for forming the self-alignment contact plug. Accordingly, a resistance value of the self-alignment contact plug resistor is also changed.

This variation in the resistance value of the self-alignment contact plug resistor causes a certain property of a semiconductor device provided with the resistor to be unstable.

On the other hand, the plate electrode resistor have a lower resistance value than polysilicon, and then the thickness of a titanium nitride layer which is used as a main passage of electrons varies according to a process condition. Consequently, the width of a plate electrode can also be varied according to conditions of a light exposure process and a developing process which are used in photolithography. In addition, the titanium nitride layer and the polysilicon layer are patterned on the entire surface of a cell array region. However, in a peripheral circuit region, only a certain area in which a resistor will be formed later, is patterned, thereby bring about a loading phenomenon. Consequently it is difficult to obtain a resistor of a desired size.

When metal which is one of conductive materials is used as a plate electrode, the length of a plate electrode resistor must be increased, because metal have a low face resistance.

SUMMARY OF THE INVENTION

To solve the above problems, it is an object of the present invention to provide a resistor which can prevent or reduce its value variations according to manufacturing processes of a semiconductor integrated circuit and a method for fabricating the same.

Accordingly, to achieve the above object of the invention, there is provided a resistor which is made of a conductive substance, for example, polysilicon and is formed on the top of a dummy gate electrode structure, or another resistor which is made of a conductive substance, for example, polysilicon and is formed between two neighboring dummy bit line structures which are formed on the top of the dummy gate electrode structure.

The dummy gate electrode structure includes a gate electrode which is made of a polysilicon layer and a metal silicide layer having a high melting point, and a dummy gate capping layer which is formed on the top surface of the gate electrode. The dummy bit line structure includes a dummy bit line and a dummy bit line capping layer formed on the top of the bit line. The dummy gate capping layer and the dummy bit line capping layer are formed of a substance having a high etching selection ratio with respect to each insulating layer covering the dummy gate electrode structure and the dummy bit line structure, thereby preventing the height of a resistor from varying according to a process condition or reducing the variation range of the height.

In addition, the dummy bit line structure further includes spacers which are formed at each side of the dummy bit line and the dummy bit line capping layer formed on the top of the dummy bit line. Each of the spacers are made of a substance having a high etching selection ratio with respect to the insulating layer covering the dummy bit line structure. Consequently, the width of the resistor may be prevented from varying according to a process condition.

After the dummy bit line structures are formed in the peripheral circuit area at which the bit line is formed in the cell array region, the resistor is formed between the dummy bit line structures. Consequently, the resistor can not be influenced by heat generated from an impurity ion doping process and a subsequent heat treatment process. Therefore, the variation range of the specific resistance of the resistor can be reduced considerably.

BRIEF DESCRIPTION OF THE DRAWINGS

The above objective and advantages of the present invention will become more apparent by describing in detail a preferred embodiment thereof with reference to the attached drawings.

DETAILED DESCRIPTION OF THE PRESENT INVENTION

Hereinafter, embodiments of the present invention will be described in detail with reference to the attached drawings. The present invention is not restricted to the following embodiments, and many variations are possible within the sprit and scope of the present invention.

Figure 1:
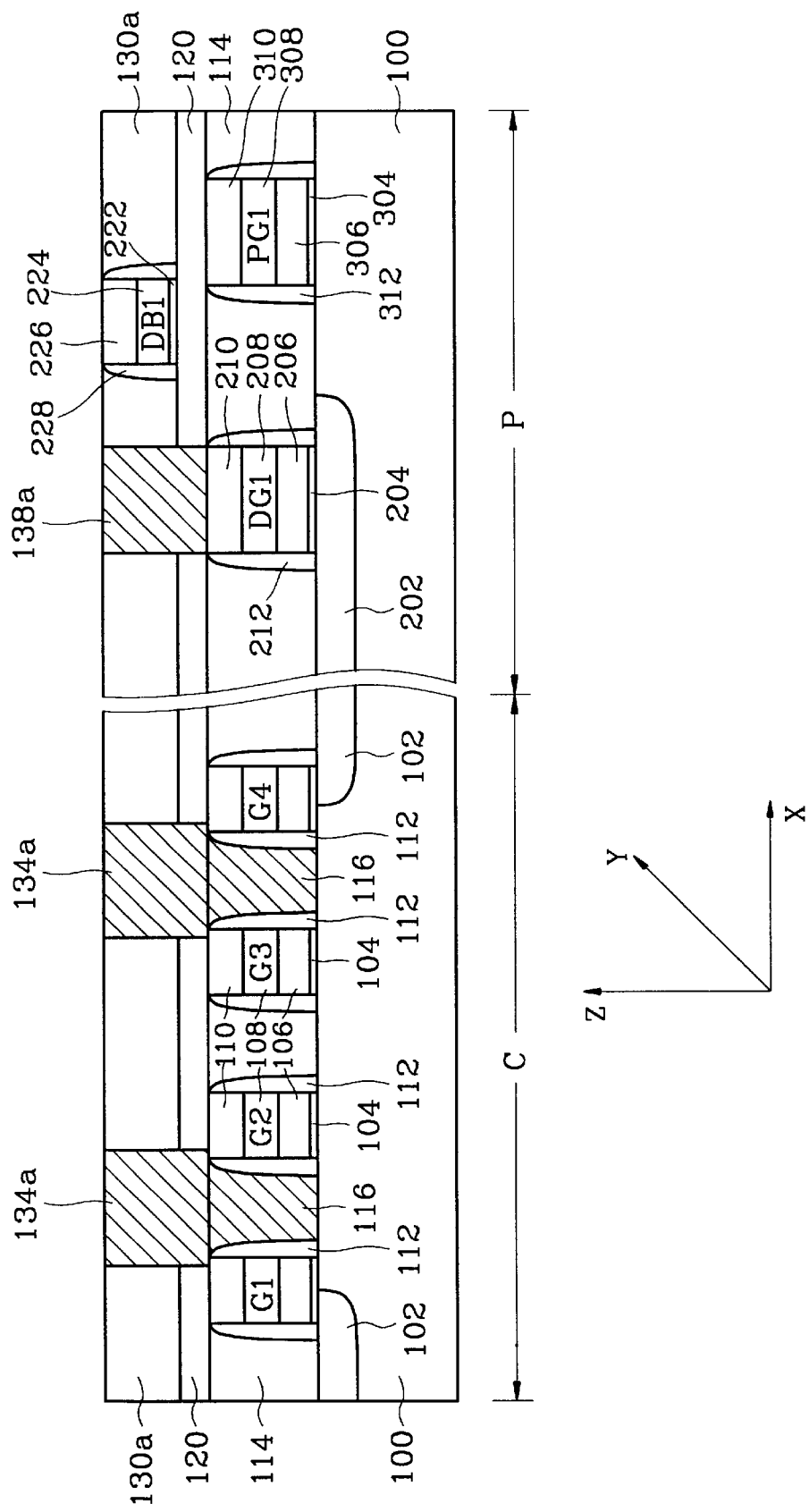
FIG. 1 is a cross sectional view illustrating a first embodiment of a resistor used in a semiconductor integrated circuit according to the present invention.

FIG. 1 is a cross sectional view illustrating a semiconductor integrated circuit provided with a resistor which is formed according to a first embodiment of the present invention.

In this figure, a semiconductor substrate 100 is divided into two regions including a cell array region (C) and a peripheral circuit region (P). In the cell array region (C), a plurality of gate electrode structures G1, G2, G3, and G4 are formed on the semiconductor substrate of an active region limited by a device separating layer 102. Each of the gate electrode structures G1, G2, G3, and G4 includes a gate insulating layer 104, a polysilicon layer 106, a metal silicide layer 108, a gate electrode capping layer 110, and gate electrode spacers 112. In addition, storage electrode connection pads 116 which connect capacitors formed on each of the gate electrode structures to the active region on the semiconductor substrate 100, are formed between a first gate electrode structure GI and a second gate electrode structure G2, and between a third gate electrode structure G3 and a fourth gate electrode structure G4, respectively. Particularly, between the second gate electrode structure G2 and the third gate electrode structure G3, a bit line connection pad (not shown) is formed in order to connect a bit line (not shown) which is arranged in a Y direction and is extended in a X direction to the active region. A first interlayer insulating layer 114 has the same width as the height of each of the gate electrode structures G1, G2, G3, and G4, and fills up the gap between the gate electrode structures. In addition, the first interlayer insulating layer 114 is formed of a substance having a high etching selection ratio with respect to the gate electrode spacers 112 and the gate electrode capping layer 110. On the top surface of the first interlayer insulating layer 114, a second interlayer insulating layer 120 is formed. A bit line is formed on the top surface of the second interlayer insulating layer 120, and the bit line is connected to the bit line connection pad (not shown) with a bit line connection plug (not shown). Finally, a third interlayer insulating layer 130A is formed on the second interlayer insulating layer 120 in which the bit line is arranged. In the second and third interlayer insulating layers 120 and 130A, a storage electrode connection plug 134A is formed in the manner of self-alignment.

In the peripheral circuit region (P), a dummy gate electrode structure DG1 and a gate electrode structure PG1 including a driver and an amplifier are formed. The dummy gate electrode structure DG1 is arranged between the peri gate electrode structure PG1 and the gate electrode structures G1, G2, G3, and G4 belonging to the cell array region, thereby preventing the first interlayer insulating layer 114 from dishing. The peri gate electrode structure PG1 and the dummy gate electrode structure DG1 are formed at the same process step when the gate electrode structures G1, G2, G3, and G4 in the cell array region (C) are formed. The peri gate electrode structure PG1 and the dummy gate electrode structure DG1 each includes a gate insulating layer 204 and 304, a poly silicon layer 206 and 306, a metal silicide layer having a high melting point 208 and 308, a capping layer 210 and 306 and a pair of spacers 212 and 312. Preferably, the capping layer 210 and 310 and the spacers 212 and 312 are formed of a substance having a high etching selection ratio with respect to the first interlayer insulating layer 114.

In the peripheral circuit region (P), a dummy bit line structure DB1 is formed on the second interlayer insulating layer 120 in the same process step as a dummy bit line structure of a cell array region (C) is formed in. The dummy bit line structure DB1 consists of a barrier layer 222, a dummy bit line 224, a dummy bit line capping layer 226, and two dummy bit line spacers 228. The dummy bit line structure (DB1) is introduced in order to prevent the dishing phenomenon of the third interlayer insulating layer 130A which is caused by mechanical and chemical grinding processes for forming the storage electrode connection plug 134A in the cell array region (C). The third interlayer insulating layer 130A as mentioned above is formed on the top surface of the second interlayer insulating layer 120 on which the dummy bit line structure DB1 is formed. The third interlayer insulating layer has the same width as the height of the dummy bit line structure DB1. A resistor 138A formed of conductive material for example polysilicon is formed within the second and third interlayer insulating layers 120 and 130A.

As described above, the poly resistor 138A is formed on the top of the dummy gate electrode structure DG1 belonging to the peripheral circuit region and the height of the resistor 138A is set on the basis of the height of the dummy bit line structure DB1. Consequently, it is possible to realize a resistor whose range of height variations without increasing the size of a semiconductor integrated circuit including the resistor.

Figure 2:
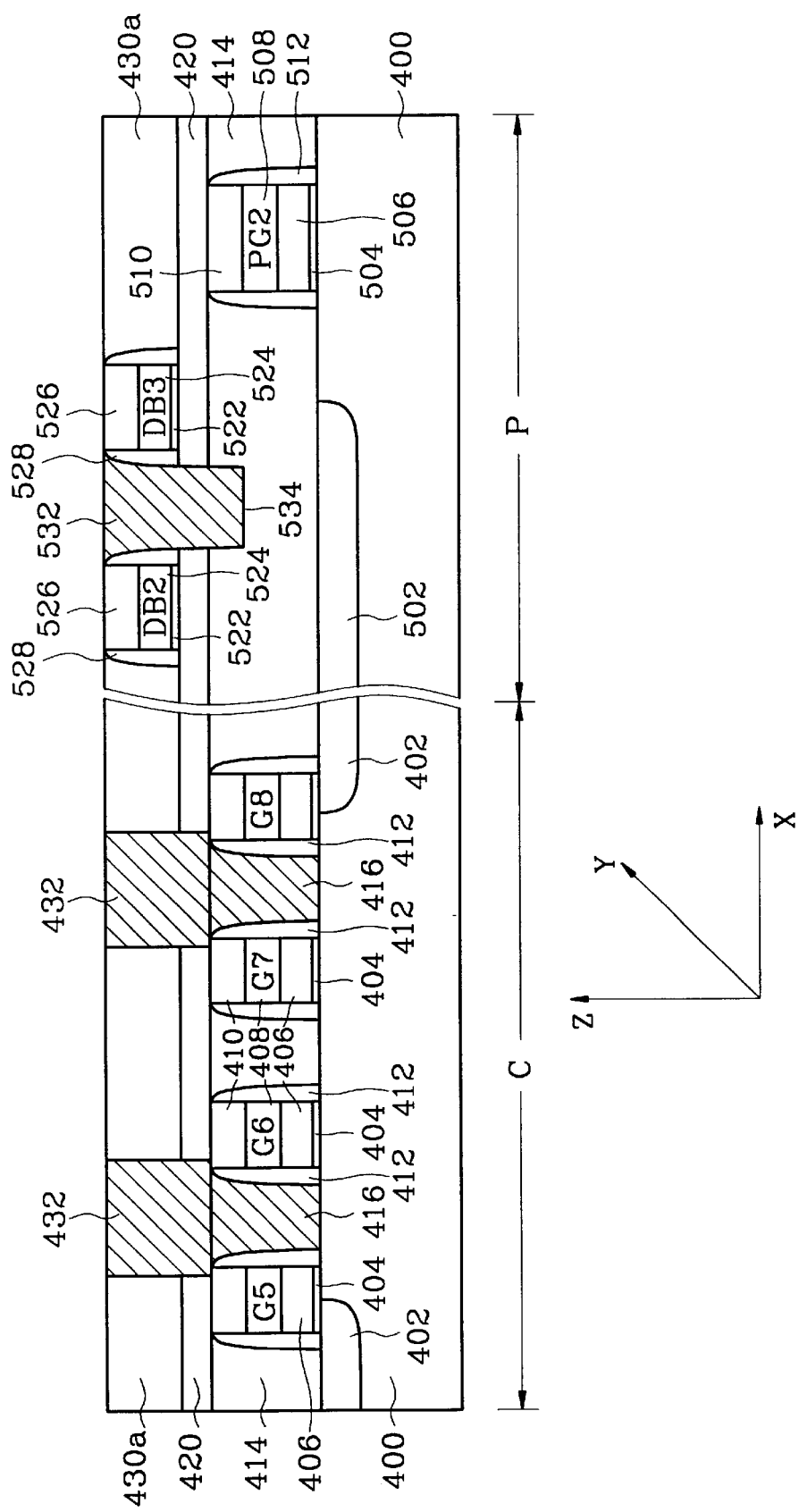
FIG. 2 is a cross sectional view illustrating a second embodiment of a resistor used in a resistor of a semiconductor integrated circuit according to the present invention.

FIG. 2 is a cross sectional view illustrating a semiconductor integrated circuit provided with a resistor which is formed according to a second embodiment of the present invention.

The semiconductor integrated circuit illustrated in this figure, is similar to that of FIG. 1 in the structure and components. For example, gate electrode structures G5, G6, G7, and G8 formed on a semiconductor substrate 400 in a cell array region (C), a storage electrode connection pad 416 in a first interlayer insulating layer 414, a bit line (not shown) which is arranged in a Y direction and is extended in a X direction, a bit line connection pad (not shown) formed in the first interlayer insulating layer 414, a storage electrode connection plug 432 within the second and third interlayer insulating layers, and a bit line structure connection plug (not shown) formed within the second interlayer insulating layer 420 are identical to those of the first embodiment, respectively. In this figure, reference numerals 402, 404, 406, 408, and 410 indicates a device separating layer, a gate insulating layer, a polysilicon layer, a metal silicide layer having a high melting point, and a gate electrode capping layer, respectively. Finally, reference numeral 412 indicates a gate electrode spacer.

In a peripheral circuit region (P), a peri gate electrode structure PG2 is formed on the semiconductor substrate 400 in which another device separating layer 502 is formed. The peri gate electrode structure PG2 like the PG1 of FIG. 1, consists of a gate insulating layer 502, a polysilicon layer 504, a metal silicide layer having a high melting point 506, a peri gate electrode capping layer 510, and a pair of peri gate spacers 512. Preferably, the capping layer 510 and the spacers 512 are each formed of a substance having a high etching selection ratio with respect to the first interlayer insulating layer 414. The height of the peri gate electrode structure PG2 is adjusted to the thickness of the first interlayer insulating layer 414. A second interlayer insulating layer 420 and a third interlayer insulating layer 430A are sequentially formed on the first interlayer insulating layer 414. A pair of dummy bit line structures DB2, DB3 are formed on the top surface of the second interlayer insulating layer 420 within the third interlayer insulating layer 430A. Between the dummy bit line structures a resistor 532 made of a conductive material, that is, polysilicon, is formed. Each of the dummy bit line structures includes a barrier layer 522, a dummy bit line 524, a dummy bit line capping layer 526, and dummy line spacers 524. The dummy bit line capping layer 526 is formed of a material having a high etching selection ratio with respect to the third interlayer insulating layer 430A and its top surface is made to have the same level with the top surface of the resistor 532. In addition each of the dummy line spacers 528 are also formed of a material having a high etching selection ratio with respect to the third interlayer insulating layer 430A and the width of the poly resistor 532 is set according to the manner of self-alignment. In other words, the width of the poly resistor 532 is formed uniformly in the manner of self-alignment without being influenced by misalignment of a mask used for forming the poly resistor. Therefore, variations in a resistance value of the poly resistor 532 can be reduced.

In FIG. 2, the dummy bit line structures DB2 and DB3 are formed on the first interlayer insulating layer 414 having no dummy gate electrode structure within itself. The bottom side 534 of the poly resistor is formed within the first interlayer insulating layer 414. However, it is also possible to make the bottom side of the poly resistor have the same level with the bottom side of the second interlayer insulating layer 420 or the top surface of the semiconductor substrate 400. In this figure, the device separating layer 502 formed in the semiconductor substrate is placed under the poly resistor 532. In certain cases, instead of a device separating layer, an active region can be formed under a resistor.

Figure 3:
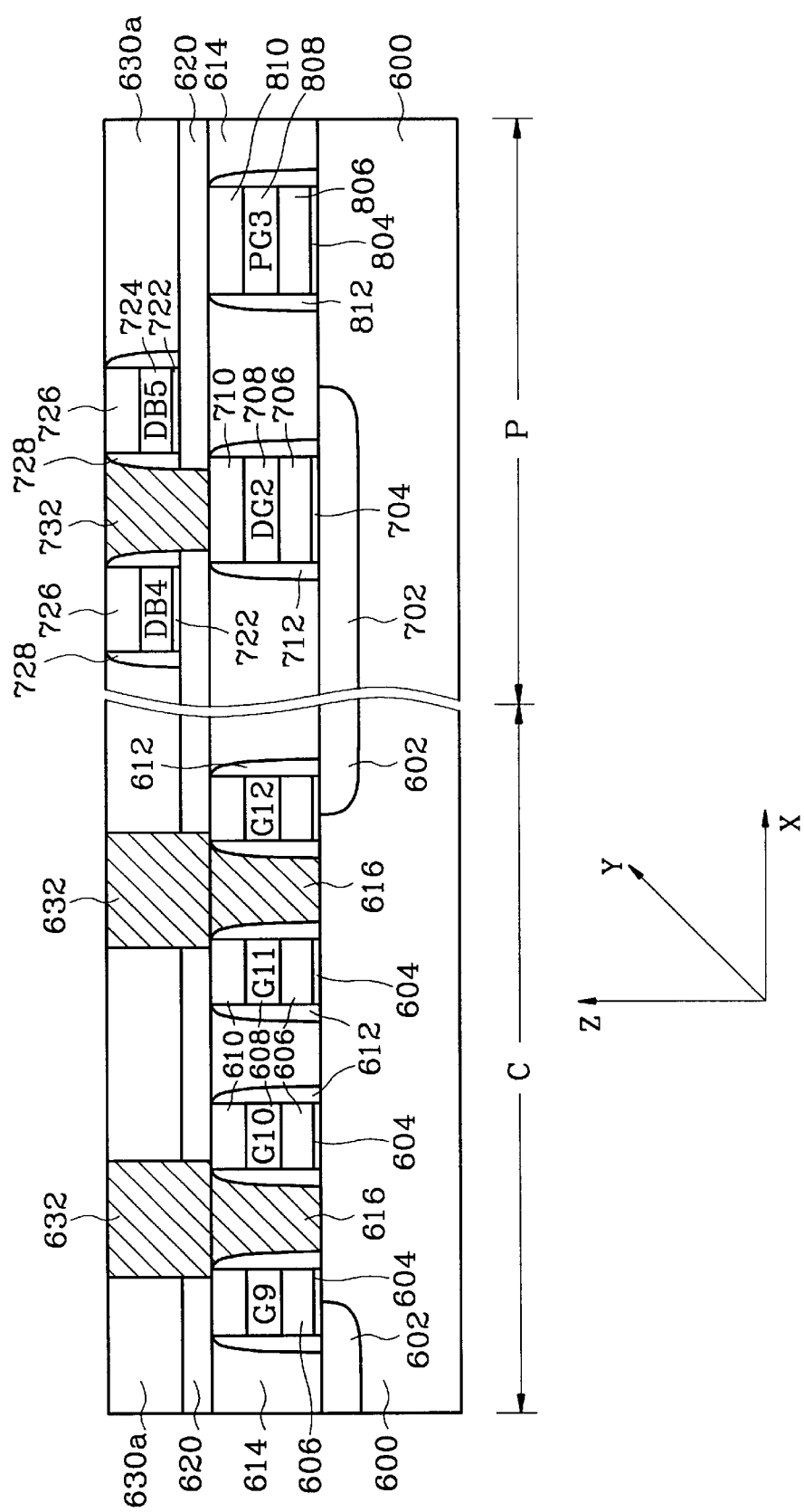
FIG. 3 is a cross sectional view illustrating a third embodiment of a resistor used in a semiconductor integrated circuit according to the present invention.

FIG. 3 is a cross sectional view illustrating a third embodiment of a resistor used in a semiconductor integrated circuit according to the present invention.

The semiconductor integrated circuit illustrated in this figure, is similar to those of FIGS. 1 and 2 in the structure and components. For example, gate electrode structures G9, G10, G11, and G12 formed on a semiconductor substrate 600 in a cell array region (C), a storage electrode connection pad 616 in a first interlayer insulating layer 614, a bit line (not shown) which is arranged in a Y direction and is extended in a X direction, a bit line connection pad (not shown) formed in the first interlayer insulating layer 614, a storage electrode connection plug 632 within the second and third interlayer insulating layers 620 and 630A, and a bit line structure connection plug (not shown) formed within the second interlayer insulating layer 620 are identical to those of the first and second embodiments, respectively. In this figure, reference numerals 602, 604, 606, 608, and 610 indicates a device separating layer, a gate insulating layer, a polysilicon layer, a metal silicide layer having a high melting point, and a gate electrode capping layer, respectively. Finally, reference numeral 612 indicates a gate electrode spacer.

In a peripheral circuit region (P), a dummy gate electrode structure DG2 and a peri gate electrode structure PG2 are formed on the semiconductor substrate 600 in which a device separating layer 702 is formed. The dummy gate electrode structure DG2 like the DG1 of FIG. 1 includes a gate insulating layer 704, a polysilicon layer 706, a metal silicide layer having a high melting point 708, a dummy gate electrode capping layer 710, and a pair of spacers 712. The peri gate electrode structure PG3 like the PG2 of FIG. 2 includes a gate insulating layer 802, a polysilicon layer 804, a metal silicide layer 806, a peri gate electrode capping layer 810, and a pair of peri gate electrode spacers 812.

Preferably, the capping layers 710 and 810 and the spacers 712 and 812 are each formed of a substance having a high etching selection ratio with respect to the first interlayer insulating layer 614. The heights of the dummy gate electrode structure DG2 and the peri gate electrode structure PG2 are each adjusted to the thickness of the first interlayer insulating layer 614. A second interlayer insulating layer 620 and a third interlayer insulating layer 630A are sequentially formed on the first interlayer insulating layer 614. A pair of dummy bit line structures DB4, DB5 are formed on the top surface of the second interlayer insulating layer 620, and a poly resistor 532 made of a conductive material, that is, polysilicon, is formed between the dummy bit line structures. The bottom side of the poly resistor 732 is in contact with the top surface of the capping layer 712 of the dummy gate electrode structure DG2. Each of the dummy bit line structures DB4 and DB5 includes a barrier layer 722, a dummy bit line 724, a dummy bit line capping layer 726, and dummy line spacers 724. The dummy bit line capping layer 726 is formed of a material having a high etching selection ratio with respect to the third interlayer insulating layer 630A and its top surface is made to have the same level with the top surface of the resistor 732. In addition each of the dummy line spacers 728 are also formed of a material having a high etching selection ratio with respect to the third interlayer insulating layer 630A and the width of the poly resistor 732 is set according to the manner of self-alignment.

The capping layer 710 of the dummy gate electrode structure DG2 is formed of a material having a high etching selection ratio with respect to the second interlayer insulating layer 620. Accordingly, the height of the poly resistor 732 is not influenced sensitively by a process condition, and it is determined to be in a range between the two top surfaces of the capping layer 710 of the dummy gate electrode and the dummy bit line capping layer 726. Therefore the width and height of the poly resistor 732 of FIG. 3 are uniformly maintained regardless of a process condition and then the poly resistor 732 have a stable resistance.

FIGS. 4 through 7 are sectional views illustrating a manufacturing process for fabricating a resistor of a semiconductor integrated circuit according to the first embodiment of the present invention.

Figure 4:
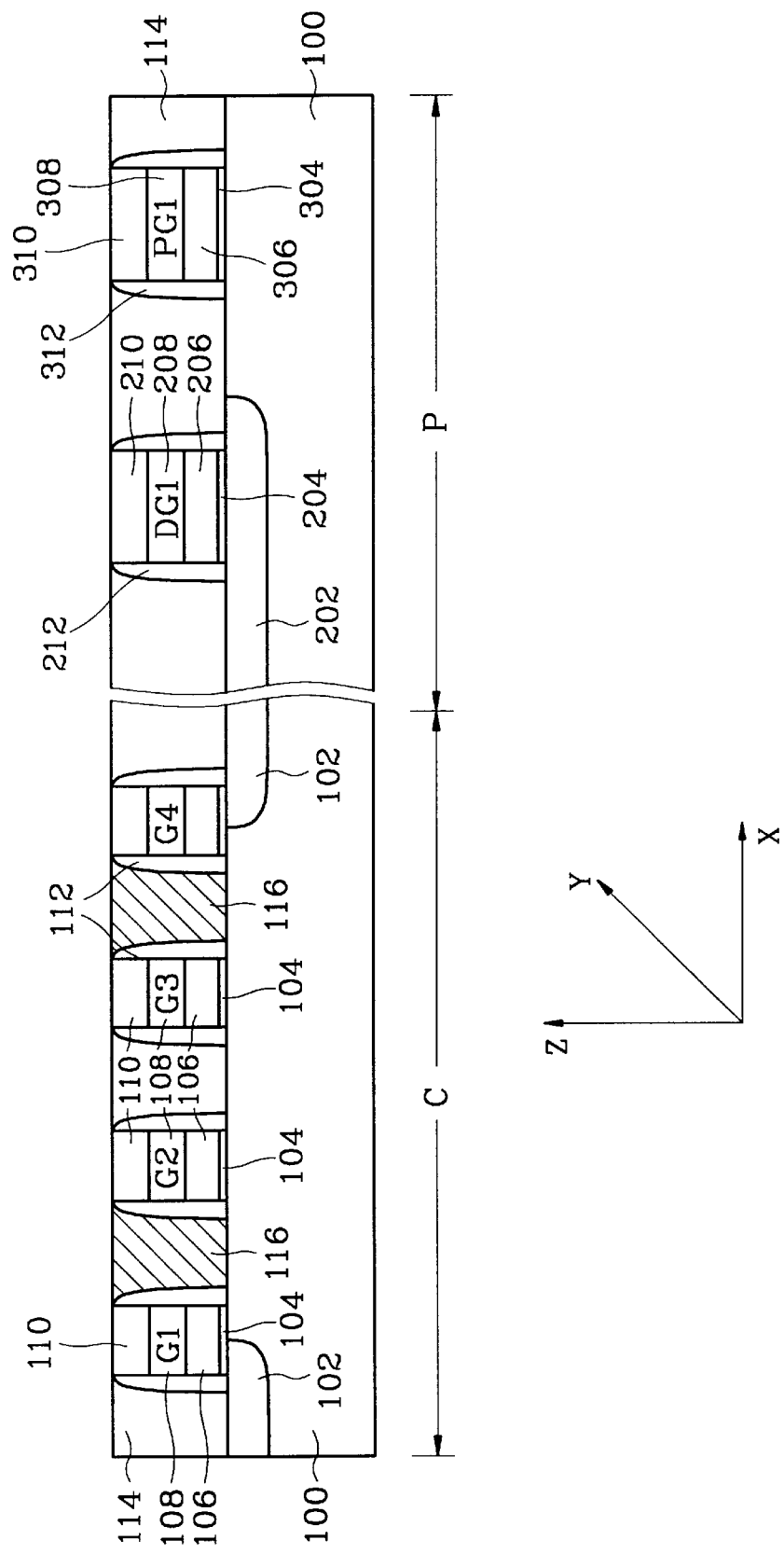
FIGS. 4 through 7 are sectional views illustrating a manufacturing process for fabricating a resistor of a semiconductor integrated circuit according to the first embodiment of the present invention.

In FIG. 4, a semiconductor substrate 100 including a cell array region (C) and a peripheral circuit region (P) is prepared. Device separating layers 102 and 202 are formed on the semiconductor substrate 100. In the cell array region (C), a plurality of gate electrode structures G1, G2, G3, and G4 are formed on the semiconductor substrate 100. At the same time, a dummy gate electrode structure DG1 and a peri gate electrode structure PG1 are formed on the semiconductor substrate 100 belonging to the peripheral circuit region (P). Each of the gate electrode structures G1, G2, G3, and G4 includes a gate insulating layer 104, a gate electrode made of a polysilicon layer 106 and a metal silicide layer 108 having a high melting point, a gate electrode capping layer 110 on the top surface of the gate electrode and gate electrode spacers 112. The dummy gate electrode structure DG1 and the peri gate electrode structure PG1 include gate insulating layers 204 and 304, respectively, gate electrodes 206+208 and 306+308, respectively, capping layers 210 and 310, spacers 212 and 312, respectively.

Next, an insulating material layer (not shown) is formed on the entire surface of the above semiconductor integrated circuit and subsequently a contact hole (not shown) is formed within the insulating material layer belonging to the cell array region (C). Next, a conductive material layer, for example, a polysilicon layer (not shown) is formed on the top surface of the insulating material layer including the contact hole. After the formation of the conductive material layer, this semiconductor substrate on which the polysilicon layer is formed, is leveled with use of mechanical and chemical grinding methods. The gate electrode capping layer 110, the dummy gate electrode capping layer 210 and the peri gate electrode capping layer 310 each have a high etching selection ratio with respect to the insulating material layer. Therefore the leveling process continues until the top surfaces of the gate electrode capping layer 110, the dummy gate electrode 210 and the peri gate electrode capping layer 310 are exposed externally. Consequently, a storage electrode connection pad 116 and/or a bit line connection pad (not shown) whose top surfaces are each placed in a desired position, can be formed.

Figure 5:
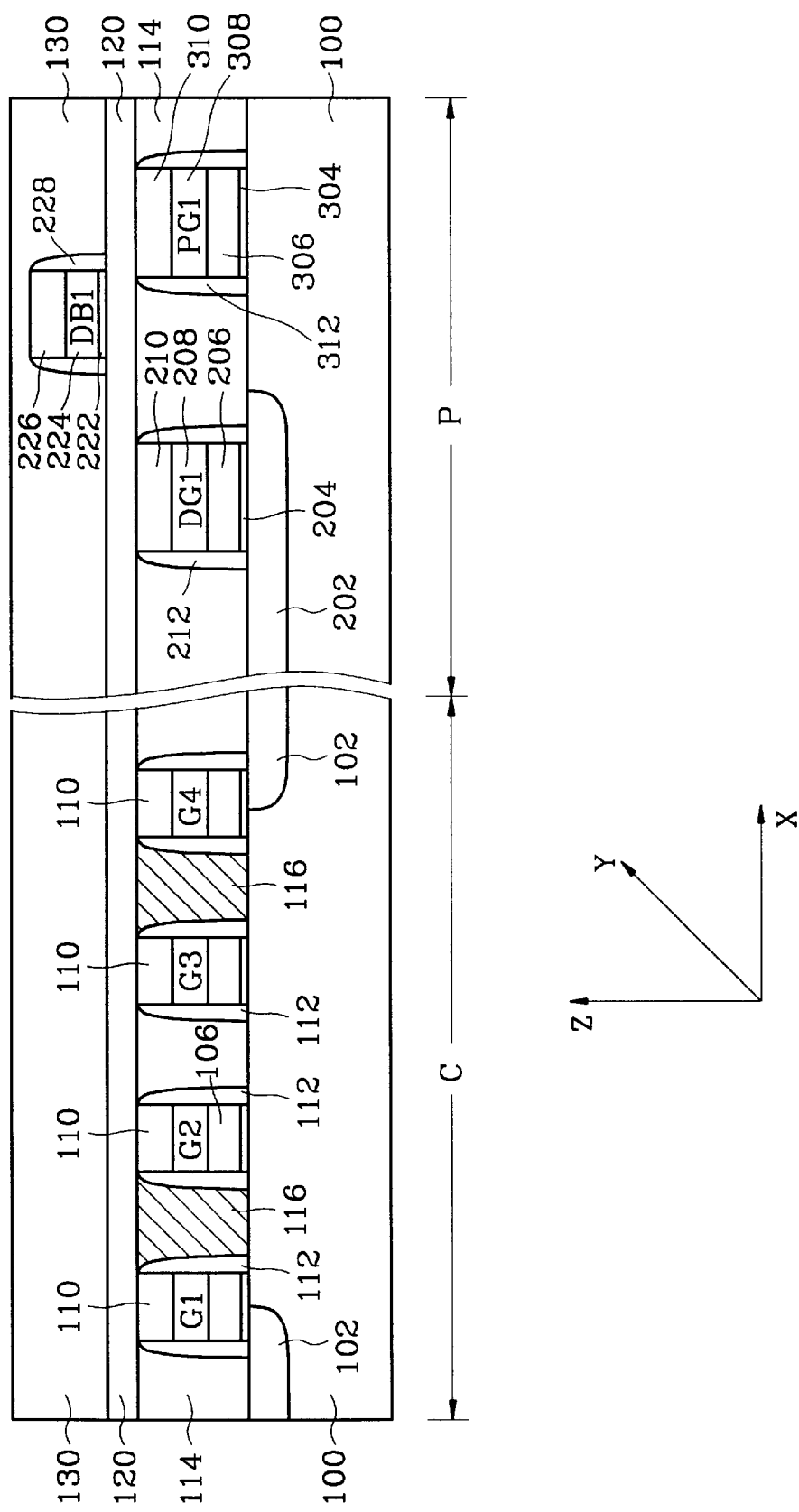

In FIG. 5, a second interlayer insulating layer 120 is formed on the leveled top surface of the first interlayer insulating layer 114. The second interlayer insulating layer 120 is an interposed layer to insulate the storage electrode connection pad 116 from a bit line (not shown) formed later. Next, an opening is formed in a predetermined area of the second interlayer insulating layer 120 and subsequently the opening is filled up with a conductive material, for example, polysilicon so as to form a bit line connection plug. The bit line connection plug (not shown) is directly connected to the bit line. While a bit line structure (not shown) is formed on the second interlayer insulating layer belonging to the cell array region (C), a dummy bit line structure DG1 is formed on the second interlayer insulating layer belonging to the peripheral circuit region (P), however the dummy bit line structure DG1 is made of the same material with the bit line structure. The bit line structure in the cell array region (C) is arranged in a Y direction and it is extended in a X direction. The dummy bit line structure DG1 includes a dummy barrier layer 222, a dummy bit line 224, a dummy bit line capping layer 226 and spacers 228. Next, an insulating material layer 130 is formed on the second interlayer insulating layer 120 on which the bit line structure and the dummy bit line structure DB1 are formed.

Figure 6:
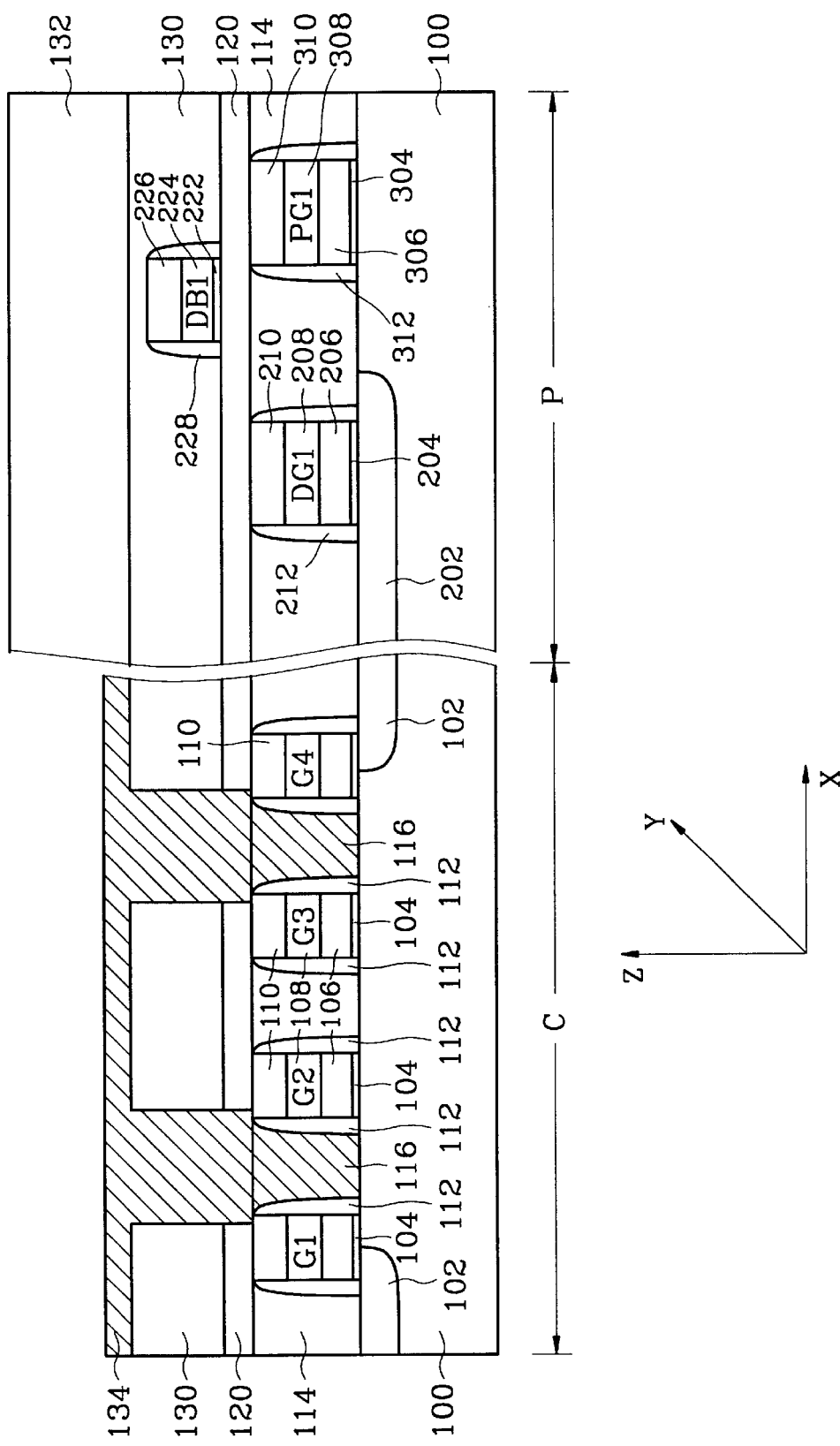

In FIG. 6, the peripheral circuit region is covered with a mask 132 and then the insulating material layer 130 and the second interlayer insulating layer 120 are etched to form an opening which exposes the storage electrode connection pad 116. After the formation of the opening, a conductive layer, that is, a polysilicon layer 134 is formed on the top surface of the insulating material layer 130 including the opening.

Figure 7:
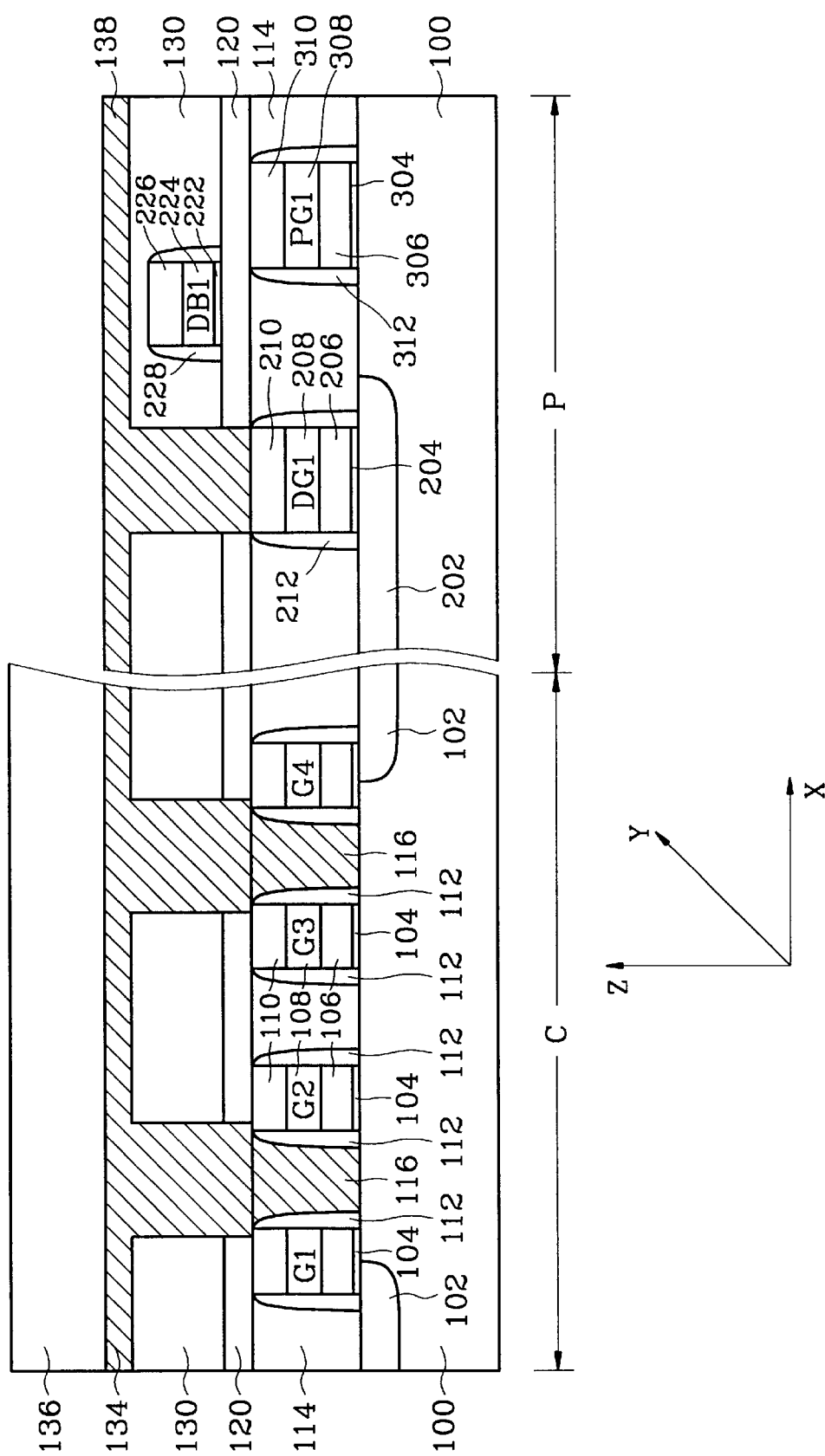

In FIG. 7, the mask 132 formed on the peripheral circuit region (P) is removed and then another mask 136 which covers only the cell array region (C) is formed. Next, an opening which exposes the top surface of the capping layer 210 of the dummy gate electrode structure DG1 is formed and then a polysilicon layer 138 is formed on the top surface of the insulating material layer 130 including the opening.

Next, the mask 136 is removed and subsequently the insulating material layer 130 is grinded mechanically and chemically. The grinding process continues until the top surface of the capping layer 226 of the dummy bit line structure DB1 is completely exposed. After the process, the shape of the semiconductor integrated circuit of FIG. 7 is changed into that of FIG. 1.

As described above, the poly resistor 138A is formed on the dummy gate electrode structure which is conventionally used in a semiconductor integrated circuit, in order to prevent a dishing phenomenon. Consequently, there is no necessity for increasing the area of a semiconductor integrated circuit to form a resistor. In addition, the capping layer 226 of the dummy bit line structure DB1 is formed of a material having a high etching selection ratio with respect to the insulating material layer 130, thereby determining the position of top surface of a poly plug resistor regardless of conditions of a grinding process. Therefore, the variation range of a resistance value of the poly plug resistor 138A can be reduced.

With respect to FIGS. 8 and 9, a manufacturing process for fabricating a resistor of a semiconductor integrated circuit according to the second embodiment of the present invention will be described in detail.

A semiconductor substrate 400 including a cell array region (C), a peripheral circuit region (P), and device separating layers 402 and 502 is prepared. A plurality of gate electrode structures G5, G6, G7, and G8 are formed on the semiconductor substrate 400 belonging to the cell array region (C). At the same time, a peri gate electrode structure PG2 is formed in the peripheral circuit region (P). The peripheral circuit region illustrated in this figure indicates only a certain area in which no dummy gate electrode structure is formed.

The gate electrode structures G5, G6, G7, and G8 and the peri gate electrode structure PG2 are identical with the gate electrode structures G1, G2, G3, and G4 and the peri gate electrode structure PG1 illustrated in FIG. 4, respectively. A first interlayer 414, a storage electrode connection pad 416, a bit line connection pad (not shown), a second interlayer insulating layer 420, a bit line structure (not shown) and an insulating material layer 430 are formed according to the methods described above with respect to FIG. 4. However, in FIG. 4 only one dummy bit line structure is formed, while in FIG. 8 a pair of dummy bit line structures are formed.

After the formation of the insulating material layer 430, an opening which exposes the storage electrode connection pad 116 is formed within the insulating material layer 430 and the second interlayer insulating layer 420 in the cell array region (C). On the other hand, in the peripheral circuit region, the insulating material layer 430, the second interlayer insulating layer 420 and the first interlayer insulating layer 414 which are located between the two dummy bit line structures are etched partially in the manner of self-alignment with use of the spacers 528 and the capping layer 526. Next, a conductive material layer, that is, a polysilicon layer (not shown) is formed on the entire surface of the resultant semiconductor integrated circuit and then a poly resistor 532 is formed by performing mechanical and chemical grinding processes. The position of the bottom side of the poly resistor 532 can be determined according to a resistance value of the poly resistor 532. The capping layer 526 is formed of a material having a high etching selection ratio with respect to the insulating material layer 430 and the third interlayer insulating layer 430A. Consequently, the grinding processes continue until the top surface of each of the dummy bit line structures DB2 and DB3 is completely exposed.

To prevent a dishing phenomenon, the poly resistor 138A is formed between the two dummy bit line structures which are conventionally used in a semiconductor integrated circuit. Consequently, there is no necessity for increasing the area of a semiconductor integrated circuit to form a resistor. In addition, the capping layers 526 of the dummy bit line structures DB2 and DB3 are formed of a material having a high etching selection ratio with respect to the insulating material layer 430, thereby determining the position of top surface of a poly plug resistor regardless of conditions of a grinding process. Moreover, the width of the poly resistor 532 is determined in the manner of self-alignment by the spacers 528, thereby the range of the width which varies according to a process condition can be reduced. Therefore, the range of a resistance value of the poly plug resistor 138A which varies according to a process condition can be reduced more as compared with the poly resistor illustrated in FIG. 7.

With respect to FIGS. 10 and 11, a manufacturing process for fabricating a semiconductor integrated circuit including a resistor which is formed according to the third embodiment of the present invention will be described in detail.

Figure 10:
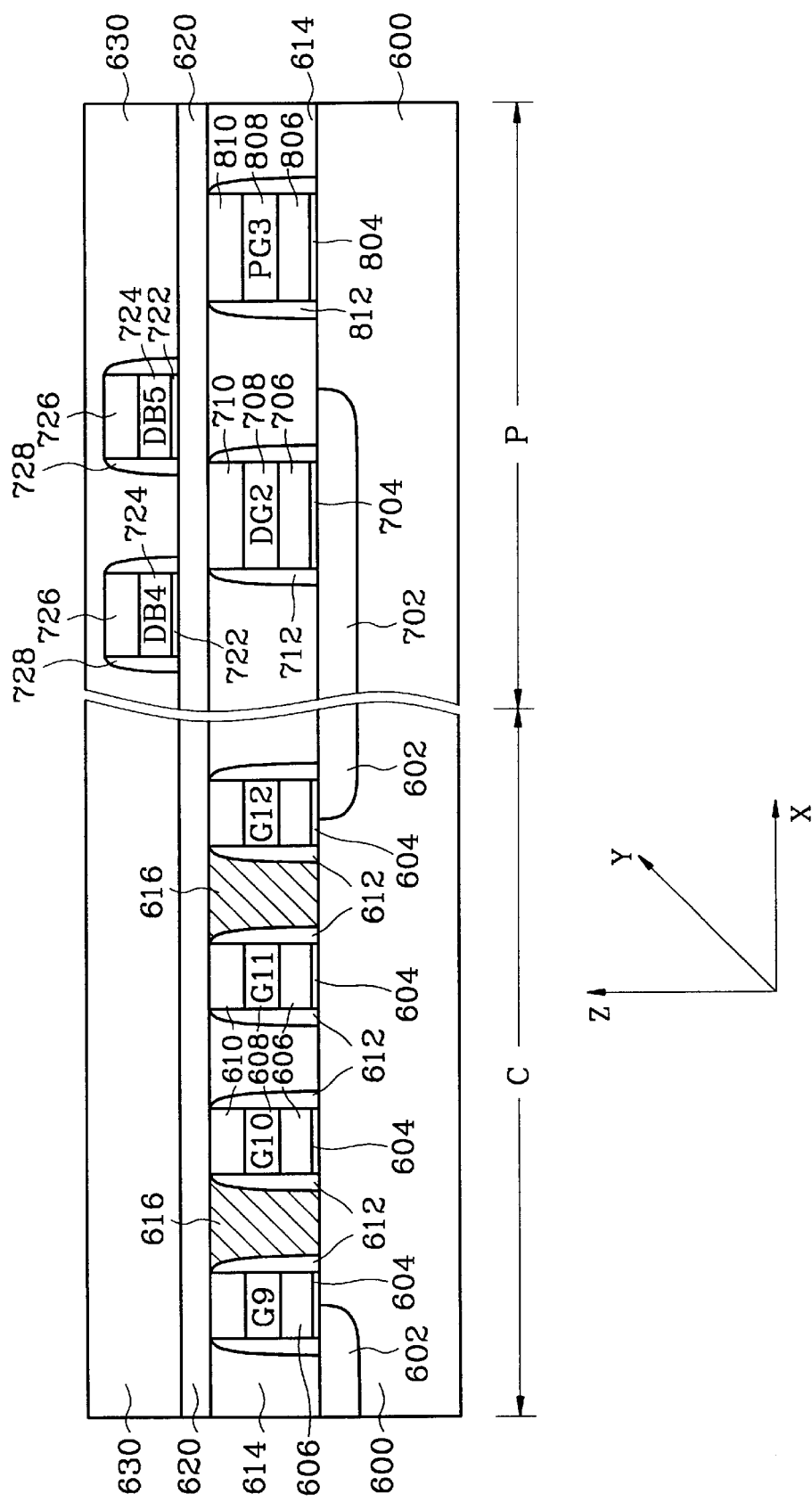
FIGS. 10 and 11 are sectional views illustrating a manufacturing process for fabricating a resistor of a semiconductor integrated circuit according to the third embodiment of the present invention.
Figure 11:
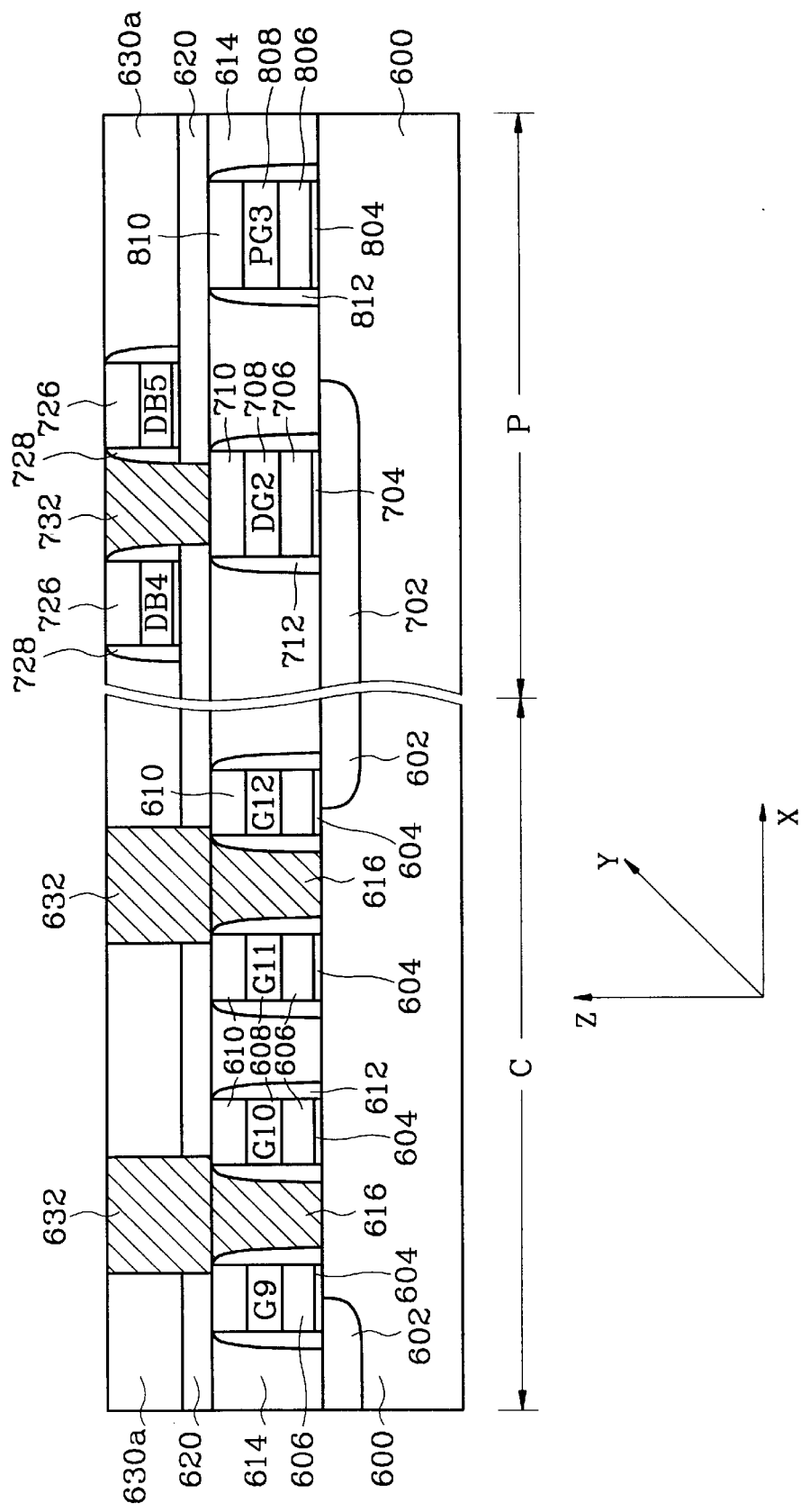

In FIG. 10, processes of forming gate electrode structures on a semiconductor substrate belonging to a cell array region (C), forming a dummy gate electrode structure DG2 and a peri gate electrode structure PG3 on the substrate belonging to a peripheral circuit region (P), covering the gate electrode structures, the dummy gate electrode structure and the peri gate electrode structure with a first interlayer insulating layer 614, forming a storage electrode connection pad 616 and/or a bit line connection pad (not shown) within the first interlayer insulating layer 614 are identical with the processes described above with respect to FIG. 4.

Figure 8:
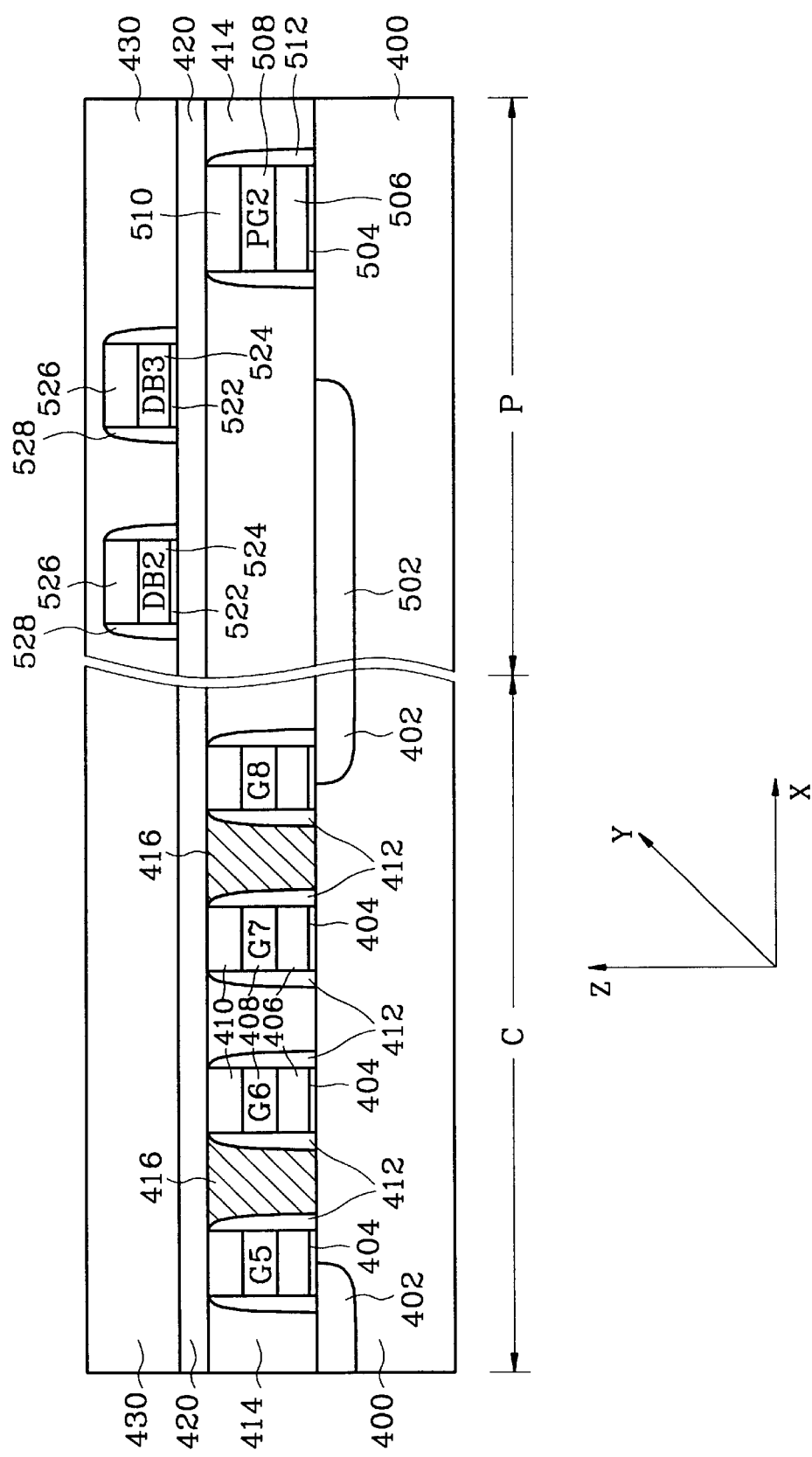
FIGS. 8 and 9 are sectional views illustrating a manufacturing process for fabricating a resistor of a semiconductor integrated circuit according to the second embodiment of the present invention.
Figure 9:
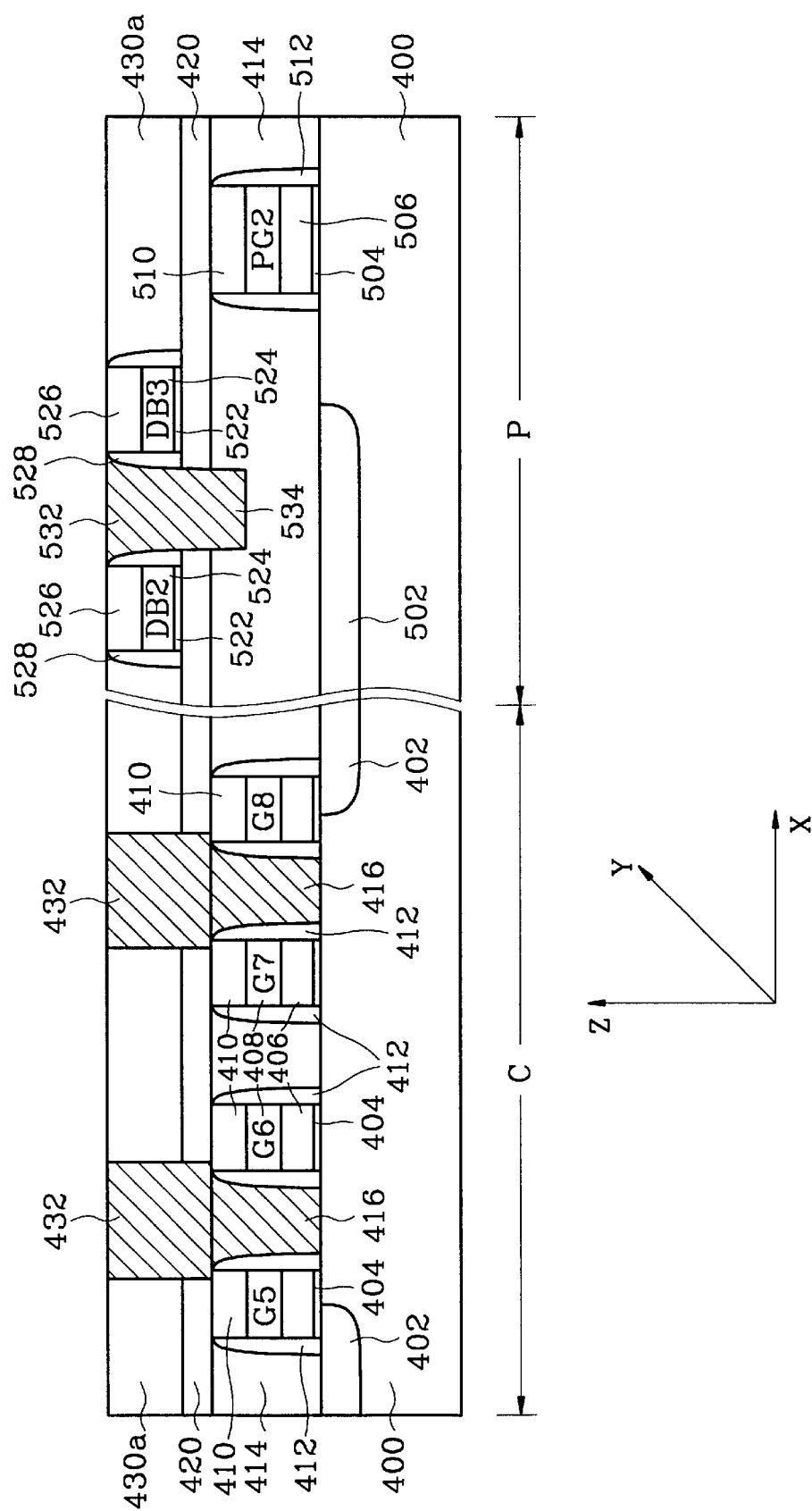

Processes of a second interlayer insulating layer 620 on the first interlayer insulating layer 614, forming a bit line connection plug (not shown) within the second interlayer insulating layer 620, forming a bit line structure (not shown) and dummy bit line structures DB4 and DB5 and forming an insulating material layer 630 which covers the dummy bit line structures DB4 and DB5 are identical with the processes described with respect to FIG. 8.

After the formation of the insulating material layer 630, in the cell array region (C), an opening which exposes the top surface of the storage electrode connection pad 616 is formed within the insulating material layer 630 and the second interlayer insulating layer 620. On the other hand, in the peripheral circuit region (P), the insulating material layer 630 and the second interlayer insulating layer 620 which are located between the two dummy bit line structures DB4 and DB5 are etched in the manner of self-alignment. The capping layer 710 of the dummy gate electrode structure DB2 is formed of a material having a high etching selection ratio with respect to the second interlayer insulating layer 620. Consequently, the self-alignment etching process continues until the top surface of the capping layer 710 of the dummy gate electrode structure DG2 is exposed.

Next, a conductive material layer, for example, a polysilicon layer (not shown) is formed on the entire surface of this semiconductor integrated circuit and then a poly resistor 732 is formed by performing mechanical and chemical grinding processes. The capping layer 726 is formed of a material having a high etching selection ratio with respect to the insulating material layer 630 or the third interlayer insulating layer 630A. Consequently, the grinding processes continue until the top surfaces of the dummy bit line structures DB4 and DB5 are exposed.

According to this embodiment of the present invention, the poly resistor 732 is formed between the two dummy bit line structures DB4 and DB5 on the dummy gate electrode structure DG2. Consequently there is no necessity for increasing the area of a semiconductor integrated circuit to form a resistor. In addition, the width of the poly resistor 732 is determined by a pair of spacers 728 and the height of the poly resistor 732 is determined by the dummy bit line capping layer 726 and the dummy gate electrode capping layer 710. Therefore the poly resistor 138A can exhibit a stable resistance value irrespective of various conditions of the grinding process.

According to the present invention, to prevent a dishing phenomenon, a resistor is formed on a gate electrode structure and/or it is formed between one pair of dummy bit line structures. Consequently it is possible to form the resistor in a peripheral circuit region without increasing the area of a semiconductor integrated circuit provided with the resistor.

Moreover, regardless of a process condition, the width and/or height of the poly resistor can be determined in a certain range by using the capping layer and spacers of the dummy gate electrode structure and/or the capping layer and/or spacers of the dummy bit line structure, thereby obtaining a stable resistance value from the resistor formed in those regions.

What is claimed is:

1. A semiconductor integrated circuit comprising:
    a semiconductor substrate including a cell array region and a peripheral circuit region;
    a dummy gate electrode structure formed on the semiconductor substrate belonging to the peripheral circuit region, said dummy gate electrode structure comprising a capping layer providing a top surface of the dummy gate electrode structure;
    an insulating layer that includes an opening formed over the top surface of the dummy gate electrode structure, said opening extending up to, but not through, the capping layer; and
    a resistor which is formed of a conductive material and fills up the opening.

2. The semiconductor integrated circuit of claim 1, wherein the dummy gate electrode structure includes a gate electrode in which a polysilicon layer and a metal silicide layer having a high melting point are sequentially formed on the semiconductor and a capping layer which is formed on the top surface of the gate electrode, and the capping layer is formed of a material having a high etching selection ratio with respect to the insulating layer.

3. The semiconductor integrated circuit of claim 1, wherein the conductive material is polysilicon.

4. The semiconductor integrated circuit of claim 1, wherein the resistor substantially entirely covers the capping layer.

5. A semiconductor integrated circuit comprising:
- a semiconductor substrate including a cell array region and a peripheral circuit region;
- a dummy gate electrode structure which is formed on the semiconductor substrate belonging to the peripheral circuit region;
- an insulating layer which includes an opening on the top of the dummy gate electrode structure and covers the dummy gate electrode structure;
- a resistor which is formed of a conductive material and fills up the opening;
- a first dummy bit line structure which is in contact with one side of the resistor; and
- a second dummy bit line structure which is in contact with the other side of the resistor.

6. The semiconductor integrated circuit of claim 5, wherein the first dummy bit line structure and the second dummy bit line structure are placed in the same level with the insulating layer.

7. A semiconductor integrated circuit of claim 5, wherein the first dummy bit line structure and the second dummy bit line structure each include a dummy bit line consisting of a barrier layer and a conductive material layer, a dummy bit line capping layer, and each of the dummy bit line capping layers is formed of a material having a high etching selection ratio with respect to the insulating layer.

8. The semiconductor integrated circuit of claim 7, wherein the first dummy bit line structure and the second dummy bit line structure each includes a pair of dummy bit line spacers which are formed at each side of them and are made of a material having a high etching selection ratio with respect to the insulating layer.

9. A semiconductor integrated circuit comprising:
- a semiconductor substrate including a cell array region and a peripheral circuit region;
- two or more dummy bit line structures formed in an insulating layer belonging to the peripheral circuit region; and
- a resistor having opposite sides contacted by spacers of the adjacent dummy bit line structures, wherein the spacers have a high etching selection ratio with respect to the insulating layers.

10. The semiconductor integrated circuit of claim 9, wherein the resistor is extended to an inner part of a second insulating layer.

11. The semiconductor integrated circuit of claim 9, further comprising a dummy electrode gate structure, wherein the resistor is arranged over and extends to the dummy electrode gate structure.

12. The semiconductor integrated circuit of claim 9, wherein the resistor comprises polysilicon.

13. The semiconductor integrated circuit of claim 11, wherein the dummy gate electrode structure comprises a gate electrode and a capping layer, said gate electrode having a polysilicon layer and a metal suicide layer sequentially formed on the semiconductor, and said capping layer being formed on a top surface of the gate electrode, wherein the capping layer is formed of a material having a high etching selection ratio compared to the insulating layer.

14. The semiconductor integrated circuit of claim 13, wherein the resistor extends to, but not through, the capping layer of the dummy gate electrode structure.

15. The semiconductor integrated circuit of claim 14, wherein the resistor substantially entirely covers the capping layer of the dummy gate electrode structure.

* * * * *

UNITED STATES PATENT AND TRADEMARK OFFICE
CERTIFICATE OF CORRECTION

PATENT NO.    : 6,531,758 B2
DATED         : March 11, 2003
INVENTOR(S)   : Shin et al.

It is certified that error appears in the above-identified patent and that said Letters Patent is hereby corrected as shown below:

Title page,
Item [56], References Cited, U.S. PATENT DOCUMENTS, "5,066,997 A   11/1991 Sakurai et al. .........257/211" should read -- 5,066,997  A   11/1991  Sakurai et al. ..........357/45 --.

Column 10,
Lines 62-65, "semiconductor and a capping layer which is formed on the top surface of the gate electrode, and the capping layer is formed of a material having a high etching selection ratio with respect to" should read -- semiconductor substrate, wherein the capping layer is formed on a top surface of the gate electrode, and wherein the capping layer is formed of a material having a high etching selection ratio compared to --.

Column 11,
Line 24, "7. A semiconductor" should read -- 7. The semiconductor --.

Column 12,
Line 5, "formed in an" should read -- formed on an --.

Column 12,
Lines 8-11, "by spacers of the adjacent dummy bit line structures, wherein the spacers have a high etching selection ratio with respect to the insulating layers." should read -- by adjacent dummy bit line structures. --.
Line 13, "to an inner" should read -- to the inner --.
Lines 13-14, "of a second insulating layer." should read -- of the insulating layer. --.
Line 20, "the resistor comprises polysilicon" should read -- the conductive material is polysilicon --.
Line 24, "metal suicide layer" should read -- metal silicide layer --.

Signed and Sealed this

Twenty-fifth Day of May, 2004

JON W. DUDAS
*Acting Director of the United States Patent and Trademark Office*